(12) United States Patent
Davenport

(10) Patent No.: US 6,220,286 B1
(45) Date of Patent: Apr. 24, 2001

(54) GAS BLANKET DISTRIBUTOR

(76) Inventor: Michael L. Davenport, P.O. Box 217, Leander, TX (US) 78646-0217

( * ) Notice: Subject to any disclaimer, the term of this patent is extended or adjusted under 35 U.S.C. 154(b) by 0 days.

(21) Appl. No.: 09/239,658

(22) Filed: Jan. 29, 1999

(51) Int. Cl.[7] ................................................. C23C 16/00
(52) U.S. Cl. ..................................... 137/561 A; 118/715
(58) Field of Search .......................... 118/715; 137/561 A

(56) References Cited

U.S. PATENT DOCUMENTS

| | | | |
|---|---|---|---|
| 4,528,919 | * 7/1985 | Harbolt et al. | 111/175 |
| 4,834,020 | 5/1989 | Bartholomew et al. | 118/719 |
| 5,099,879 | * 3/1992 | Baird | 137/561 A |
| 5,136,975 | 8/1992 | Bartholomew et al. | 118/715 |
| 5,304,398 | 4/1994 | Krusell et al. | 427/255.3 |
| 5,316,032 | * 5/1994 | DeCoux | 137/14 |
| 5,683,516 | 11/1997 | DeDontney et al. | 118/715 |
| 5,944,900 | 8/1999 | Tran | 118/715 |

FOREIGN PATENT DOCUMENTS

717907 * 9/1965 (CA) ............................. 137/561 A

* cited by examiner

*Primary Examiner*—A. Michael Chambers

(57) ABSTRACT

An improved nitrogen blanket distributor is provided for use in an atmospheric pressure chemical vapor deposition (CVD) apparatus of the type used for semiconductor fabrication. In the improved distributor, the nitrogen plenums are formed using angular components replacing the tubular components known in the art, thus considerably stiffening the distributor structure. Improved multi-layer lateral seals are also provided for preventing gas flow around the distributor assembly. Furthermore, improved stress relieving features are provided in the primary screen in order to reduce thermal cycling failures of that component.

13 Claims, 6 Drawing Sheets

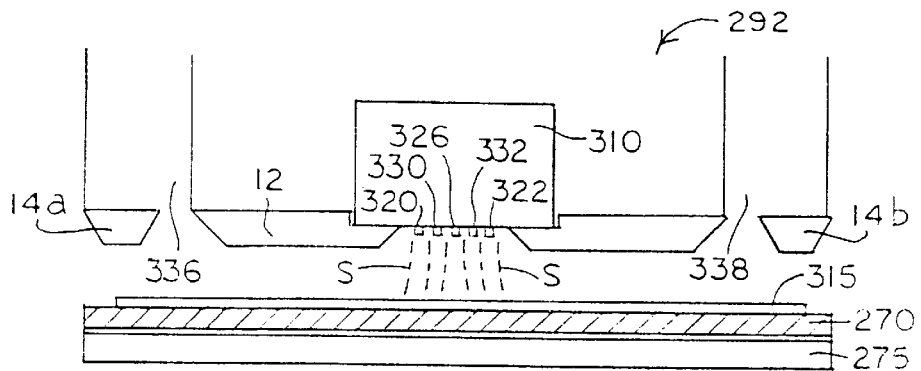
FIG. 1 PRIOR ART
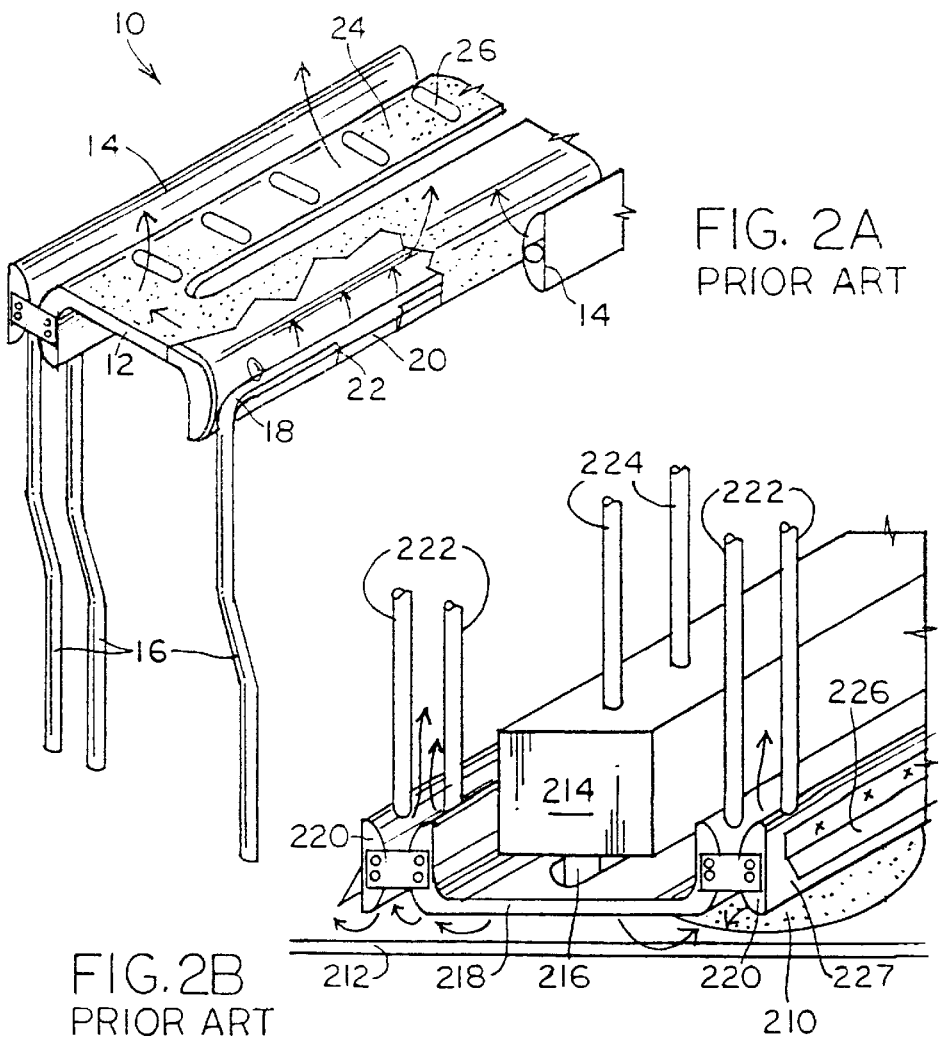
FIG. 2A PRIOR ART
FIG. 2B PRIOR ART

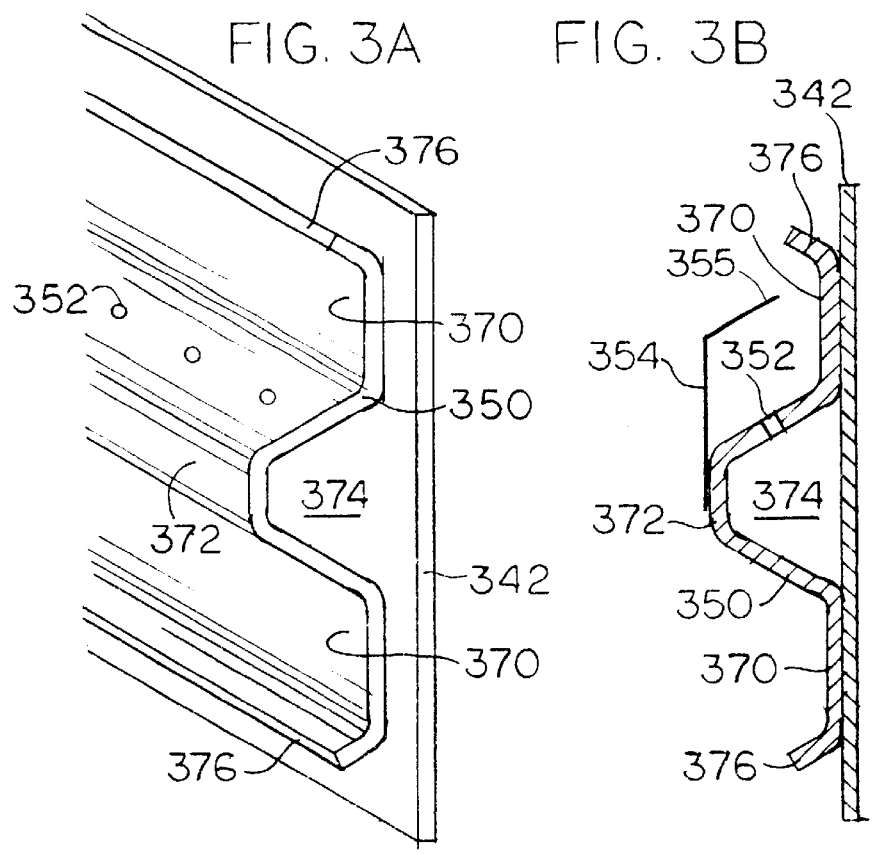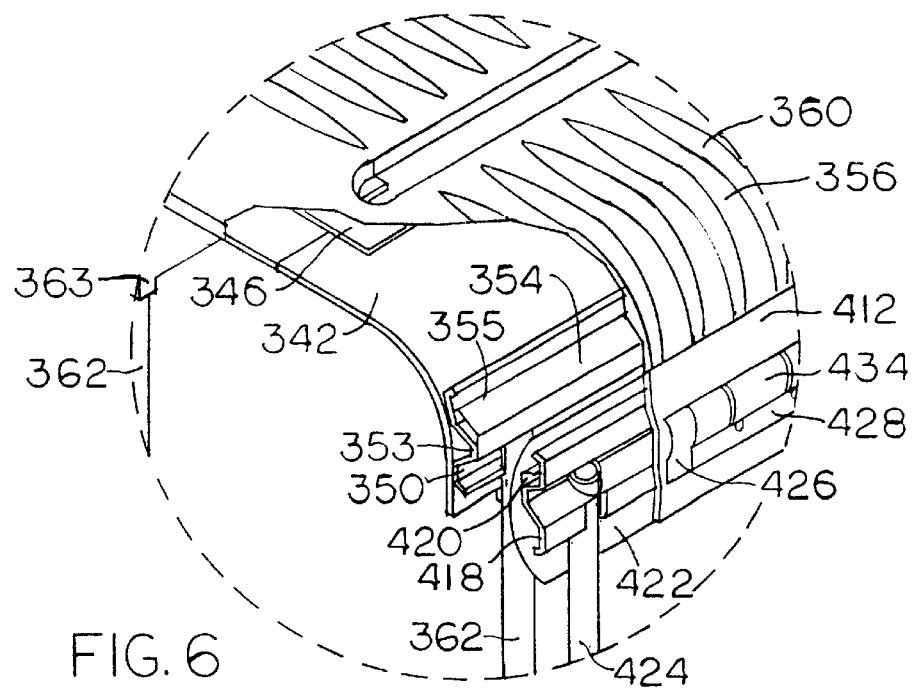

GAS BLANKET DISTRIBUTOR

FIELD OF THE INVENTION

This invention relates to improvements in semiconductor processing equipment, and in particular, in a preferred embodiment, to an improved nitrogen blanket distributor for an atmospheric pressure chemical vapor deposition (APCVD) apparatus.

BACKGROUND

Atmospheric pressure chemical vapor deposition (APCVD) is a semiconductor processing technique that is well known in the art. Several companies make APCVD apparatus for sale to semiconductor manufacturing companies. The present invention is an improvement to a prior art APCVD arrangement, as is described in detail in this specification.

U.S. Pat. No. 4,834,020 (Bartholomew, et al.) discloses a conveyorized atmospheric pressure chemical vapor deposition apparatus. This patent is assigned to Watkins-Johnson Company of Palo Alto, Calif. The apparatus described in this patent discloses use of nitrogen blanketing apparatus surrounding each deposition chamber to separate the ambient atmosphere from the deposition environment and to ensure that deposition chemicals do not escape from the immediate vicinity of the deposition chamber. Nitrogen distribution plenums are positioned on the entry side of each deposition chamber and on the exit side of each deposition chamber.

U.S. Pat. No. 5,304,398 (Krusell, et al.) also is assigned to Watkins-Johnson Company. This patent also discloses an atmospheric pressure chemical vapor deposition apparatus, which includes a gas injection assembly (indicated at reference 310 in FIG. 1 of the present specification, which is a reproduction of FIG. 3 of the Krusell, et al. patent) through which process gases and nitrogen are introduced onto the surface of wafer 315 that is processed by the apparatus. This is the type of system in which the preferred embodiment of the present invention is intended to be used. Referring to FIG. 1, the structures 12, 14a and 14b on either side of exhaust passages 336 and 338 are nitrogen distributors which provide a nitrogen blanket around the process area and the gas injection assembly 310. The function of these nitrogen distributors is to provide a steady flow of nitrogen to the regions surrounding the process gas injection operation to remove excess or spent process gasses and to prevent introduction of foreign materials into the process area. The nitrogen that is fed through these distributors is removed from the process area via exhaust passages 336 and 338, thus forming a continuous flow of inert gas surrounding the process area. The aforementioned patents are hereby incorporated by reference into this specification.

FIG. 2A shows the construction of a prior art nitrogen distributor assembly over which the present invention provides a number of improvements. Nitrogen distributor assembly 10 comprises primary nitrogen distributor 12 and secondary nitrogen distributors 14. Each distributor 12, 14 comprises a solid shell 20 and a perforated screen 24 that form an enclosed space into which nitrogen may be introduced. Nitrogen supply tubes 16 are provided to convey nitrogen from an external nitrogen source to the nitrogen distributor assembly. Inside of nitrogen distributors 12 and 14, these tubes 16 are perforated to release nitrogen within the distributors. Referring to the prior art primary distributor 12, each nitrogen tube 16 enters the distributor and is bent at a 90° angle as shown at point 18 and then welded at selected points along its length to shell 20 of primary distributor 12 beneath screen 24. A number of holes are drilled in nitrogen tube 16 proximate shell 20 in order to allow nitrogen to flow from the tube 16 into the enclosed space formed between shell 20 and screen 24 of primary nitrogen distributor 12. Baffle 22 is constructed from a thin strip of metal and attached to tube 16 at one edge and to shell 20 at the other edge. Baffle 22 is provided in order to block the direct flow of nitrogen out of the perforations in tube 16, to slow down the nitrogen flow and to allow it to evenly disperse within primary distributor 20 beneath primary screen 24. A similar structure is employed in forming secondary nitrogen distributors 14 by using a corresponding tube having holes drilled therein positioned between a secondary shell a secondary stainless steel screen.

The prior art nitrogen distributor assembly shown in FIGS. 2A and 2B employs topographic features 26 in the primary screen 24 that are intended to control temperature-cycling related failures. Because these features exist only in the planar section of the primary screen 24 and do not extend around the curve that is formed by the screen as it passes around the lateral sides of primary distributor 12, they tend to ensure that thermal-cycling failures occur primarily in the specific region of the features, rather than preventing such failures.

FIG. 2B shows a typical prior art version of a APCVD injection assembly including gas blanket distribution apparatus. A work piece, which is typically a semiconductor wafer 210, may be conveyed past the operative assembly on conveyor belt 212. Injector head 214 receives the reactant process gasses and furnishes them through injector nozzle 216, which extends through a window formed in primary nitrogen distributor 218, and onto the surface of work piece 210 as it passes beneath nozzle 216. Secondary nitrogen distributors 220 are provided on each side of primary nitrogen distributor 218. The sides of primary nitrogen distributor 218 and secondary nitrogen distributors 220 that face each other and that face toward the work piece comprise perforated screen that may be made of stainless steel, which allow nitrogen to flow from the interiors of primary distributor 218 and secondary distributors 220 and into the vicinity of work piece 210 and injector nozzle 216 such that excess and spent process gasses are diluted and carried by the nitrogen flow away from the process area and up through the exhaust channels provided between primary nitrogen distributor 218 and secondary nitrogen distributors 220. The flow of nitrogen is generally shown by the arrows in FIG. 2B.

Nitrogen supply tubes 222 are operatively connected to a source of nitrogen (or other selected blanket gas) to provide a steady flow of nitrogen into primary nitrogen distributor 218 and secondary nitrogen distributors 220. Additional tubes 224 may be used to provide reactant gasses into injector head 214. First, the secondary distributor seals used in prior art devices are subject to leaking and failure. This is due in part to the design of prior art sealing elements and in part to inadequate structural rigidity in the distributor assembly. Second, prior art devices are prone to cause "powdering," which can introduce harmful particulate contaminants into the processing area. Third, the prior art nitrogen distributor assemblies are difficult to manufacture. Finally, the perforated screens in prior art devices are known to experience stress cracking due to differential rates of thermal expansion between distributor components. Each of these deficiencies is discussed further below.

In the atmospheric pressure chemical vapor deposition (APCVD) machines that are known to the applicant, the nitrogen blanketing apparatus that is employed has several deficiencies which are corrected by the present invention.

Secondary seals 226 may be provided on the outboard side of each secondary distributor 220. Each secondary seal 226 provides a seal between secondary nitrogen distributor 220 and the wall of the enclosure into which this assembly is placed during operation, which is not shown in this illustration. (See FIG. 7) In the prior art, as shown in FIG. 2B, secondary seal 226 is a strip of flexible stainless steel, one edge of which is welded to the back of secondary nitrogen distributor 220, and the other edge of which is bent away from secondary distributor 220 in order to contact the enclosure when the distributor assembly is inserted therein. One difficulty with this arrangement is that in the event that secondary distributor 220 bends or flexes during operation due to mechanical or thermal stresses, secondary seal 226 tends to buckle thereby lose its contact with the enclosure wall over a portion of its length, and a leak in the seal can therefore be formed. One deficiency in the prior art is that the secondary distributors are not adequately stiff to resist bending as a result of mechanical and thermal stresses applied during operation, and when such bending occurs the secondary seals can become incapable of closing the space between the back of the secondary distributor and the enclosure wall.

Furthermore, prior art seals have a spring rate that is relatively large compared to the stiffness of the secondary assemblies. Thus, when the distributor assembly is forced into its enclosure, a force is developed that distorts the straightness of the secondary distributors, non-linearly distorting the gap between primary and secondary distributors. This distortion in the gap width affects the uniformity of the process by introducing unpredictable variations in the shielding gas flow pattern. Another problem is that the prior art seals are non-conformal against irregularities in the walls of the enclosure they fit within. Some prior art seals consist of a thin strip of metal incorporating a single bend away from the body of the secondary shell. A serious problem with this design becomes apparent when installation into the enclosure is attempted. Because the strip opens outward into the enclosure, there is a tendency for the leading edge of this seal to be captured by irregularities in the sealing surface causing the thin metal to buckle or suffer an otherwise catastrophic failure. An alternative prior art seal design incorporates a reentrant bend along the distal edge of the seal. This bend makes the distributor easier to insert into its enclosure, but because of the reentrant bend, the sealing edge is more rigid and therefore even less conformal than the aforementioned design.

A phenomenon referred to as "powdering" is known to occur in prior art nitrogen blanket injection assemblies. This occurs when the flow of nitrogen and process gasses becomes restricted and silicon or some other solid material becomes deposited upon surfaces within that apparatus. Those deposits can break loose and form particulate impurities which can adversely affect the semiconductor manufacturing process. In addition to providing a shielding atmosphere for the process, the nitrogen passing through the perforations in the screens serves to prevent such reaction products from building up on the outside of the distributor assemblies. Some prior art nitrogen distributors have areas of the screen that are blocked so that nitrogen cannot flow therethrough. For example, some designs include an overlying piece of the screen material around each tube penetration that in effect blocks many of the perforations in those areas. A similar problem is caused by a feature sometimes added in an attempt to stiffen the secondary assembly, wherein the edge of the secondary shell secondary is bent back upon itself. This forms a solid surface that lies beneath the perforated screen material and eliminates any possible gas flow. These features are believed to be largely responsible for producing the powdering effect noted in the prior art.

Another deficiency in the prior art nitrogen distribution assemblies is that they are not conducive to mass production manufacturing techniques, primarily because the nitrogen supply tubes are an integral part of the plenum assembly. Once they are welded to the primary and secondary shells early in the manufacturing process, the supply tubes become cumbersome impediments during the remaining stages of production. It would be preferable to be able to install the nitrogen supply tubes as a final step in the manufacturing process.

Yet another deficiency in the prior art is that the secondary distributors are relatively long, thin assemblies which may be prone to bending or flexing during use. This is undesirable because it is important to provide a reliable seal between the outboard side of the secondary distributors and the enclosure into which the assemblies are installed. It has been noted that the prior art secondary distributors are not stiff enough to prevent flexing due to mechanical forces, primarily the forces exerted by prior art seal structures. Furthermore, the seals that are used on the outboard sides of the prior art secondary distributors are not adequate, when combined with the flexibility of the secondary distributors to provide a reliable seal during use of the apparatus.

Both the primary nitrogen distributor and the secondary nitrogen distributors in the prior art have outer surfaces made of stainless steel screen material. In use, nitrogen flows from the nitrogen distribution apparatus within the nitrogen distributors and outward through the screen material into the regions surrounding the wafers being processed. During operation of these machines, the temperature of the processing chamber can fluctuate between room temperature and 600°. This temperature cycling results in flexing or "oil canning" of the perforated screen material, due to differences in the rate of thermal expansion between the screen and the shell to which it is attached. Repeated stressing of the screen material in this way results in a common mode of failure where cracks form in the surface of the screen. These cracks interrupt the desired nitrogen flow patterns and can cause undesired turbulence in the vicinity of the cracks, decreasing the effectiveness of the nitrogen blanket and the APCVD process. Some prior art distributors have features 26 formed in the screens that serve to localize stress, but the known approaches for providing stress relief are insufficient to cure the "oil canning" problem.

It is therefore desirable to provide a nitrogen blanket distribution apparatus for an atmospheric pressure chemical vapor deposition process for semiconductor processing which reduces powdering, improves manufacturability, provides stress relief for the screen material, provides improved stiffness of secondary nitrogen blanket distributors, and provides improved sealing between the secondary distributors and the walls of the enclosure in which the nitrogen blanket distributor assembly is located.

SUMMARY OF THE INVENTION

In presently preferred embodiments, the present invention provides a nitrogen blanket distributor assembly for the existing type of chemical vapor deposition equipment described above, which reduces powdering, improves manufacturability, provides stress relief for the screen material, improves the stiffness of the secondary nitrogen distributors, and provides improved seals on the outboard sides of the secondary distributors so as to provide an improved apparatus for use in existing and future chemical vapor deposition machinery.

The present invention improves manufacturability by removing the perforated tube from the distributors, replacing it with a plenum member formed of sheet metal, which may be stainless steel, which is then welded to the base plate of the injection assembly. Holes may be drilled in the plenum member in order to provide for escape of nitrogen therefrom. Openings are provided in the plenum member for placement of nitrogen feed tubes later in the manufacture process. The assembly formed by the combination of plenum member and base plate welded together provides improved stiffness of the assembly over that seen in the prior art, both in the primary distributor and in the secondary distributors. Furthermore, because the nitrogen supply tubes can be installed at the end of the manufacturing process, distributors according to this invention can be produced more accurately, consistently and efficiently without cumbersome tubes getting in the way.

In preferred embodiments of the present invention, the secondary seals are also improved by providing a two-layer, overlapping, segmented arrangement, which provides a conformal seal with less force applied to the secondary distributors, and which prevents the seals from becoming distorted or buckled and thereby leaking if there is any bending of the secondary distributors or enclosures due to thermal or mechanical stresses applied thereto.

An improved nitrogen distribution screen arrangement is also disclosed for use in preferred embodiments of the present invention. In particular, three-dimensional stress relieving features are formed into the distribution screen in order to permit the screen to absorb the applied stresses without "oil canning" and eventually failing.

In one aspect, the present invention provides a gas blanket distributor for use in a reaction chamber, said distributor comprising a primary distributor having a window for passage of an injection nozzle therethrough and a secondary distributor positioned beside and spaced from the primary distributor, each distributor comprising a plenum member attached to a shell, each plenum member being formed of an elongated piece of rigid material formed to provide two elongated and substantially parallel attachment portions separated by a raised portion, wherein the raised portion of the plenum member and the shell define an enclosed space when the plenum member is attached to the shell. The plenum member may be perforated by a plurality of holes formed in the raised portion. The assembly may further comprise a baffle having one edge attached to the raised portion of the plenum member and the other edge spaced from the plenum member, the baffle being positioned to cover said holes without sealing them.

In another aspect, the invention provides a method of making a gas blanket distributor for use in a reaction chamber, wherein the distributor includes a primary distributor having a window for passage of an injection nozzle therethrough. A preferred method comprises attaching a plenum member to a primary shell, attaching a primary screen to the primary shell, then inserting a gas supply tube through the primary screen into the plenum, and attaching the gas supply tube to the primary shell.

In yet another aspect, a preferred embodiment of the present invention provides a gas blanket distributor for use in a semiconductor processing apparatus, wherein the distributor has a lateral sealing assembly for inhibiting the flow of gas between a lateral side of the distributor and an enclosure in which the distributor is operatively positioned. The lateral sealing assembly may comprise first and second sealing strips each having a longitudinal spine portion adjacent one edge and a sealing portion adjacent the other edge. The sealing portion may be divided into segments by slots formed across the sealing portion and terminating prior to traversing the spine portion, and the spine portion of the first sealing strip may be attached along its length to the lateral side of the distributor. The spine portion of the second sealing strip may then be overlaid upon the spine portion of the first sealing strip such that the segments of the second sealing strip cover the slots of the first sealing strip.

In another aspect, preferred embodiments of the present invention provide a gas blanket distributor for use in a semiconductor processing apparatus, comprising primary distributor means for distributing a uniform flow of gas in the vicinity of a process gas injector, and secondary distributor means for distributing a uniform flow of gas therefrom, said secondary distributor means being spaced from said primary distributor means by an exhaust channel, wherein said secondary distributor means comprises a shell and a plenum member which cooperate to form an enclosed gas distribution chamber. The primary distributor means may comprise a shell and a plenum member which cooperate to form an enclosed gas distribution chamber.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiments of the invention which are illustrated in the appended drawings, which form a part of this specification.

FIG. 1 is an elevation view of a CVD nozzle and nitrogen blanket distribution assembly as is known in the prior art. This figure is adapted from FIG. 3 of U.S. Pat. No. 5,304,398.

FIG. 2A is a partially cut-away perspective illustration of a nitrogen distributor assembly as is known in the prior art, over which the present invention provides several improvements.

FIG. 2B is a perspective view of the prior art nitrogen distributor assembly of FIG. 2A, shown with the corresponding process gas injector head and nozzle, as well as a wafer being processed carried past the assembly on a conveyor belt.

FIGS. 3A and 3B are detailed views of the plenum member configuration of this invention.

FIG. 6 is an enlarged illustration of the cut-away portion of the embodiment shown in FIG. 5.

It is noted, however, that the appended drawings illustrate only exemplary embodiments of the invention and are, therefore, not to be considered limiting of its scope, for the invention may admit to other equally effective embodiments.

DETAILED DESCRIPTION OF THE INVENTION

Figure 3:
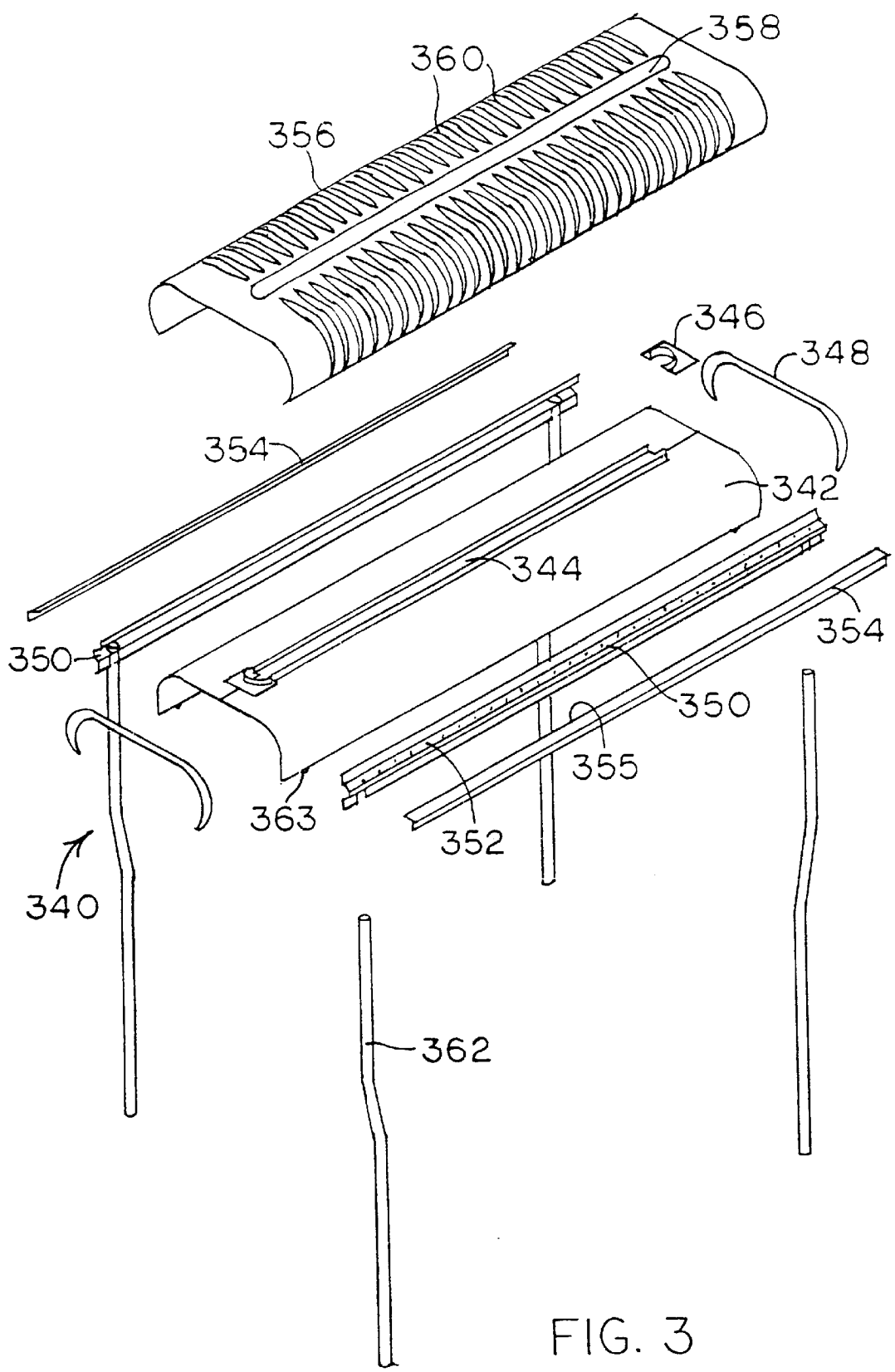
FIG. 3 is an exploded perspective view of a primary distributor according to the present invention.
Figure 5:
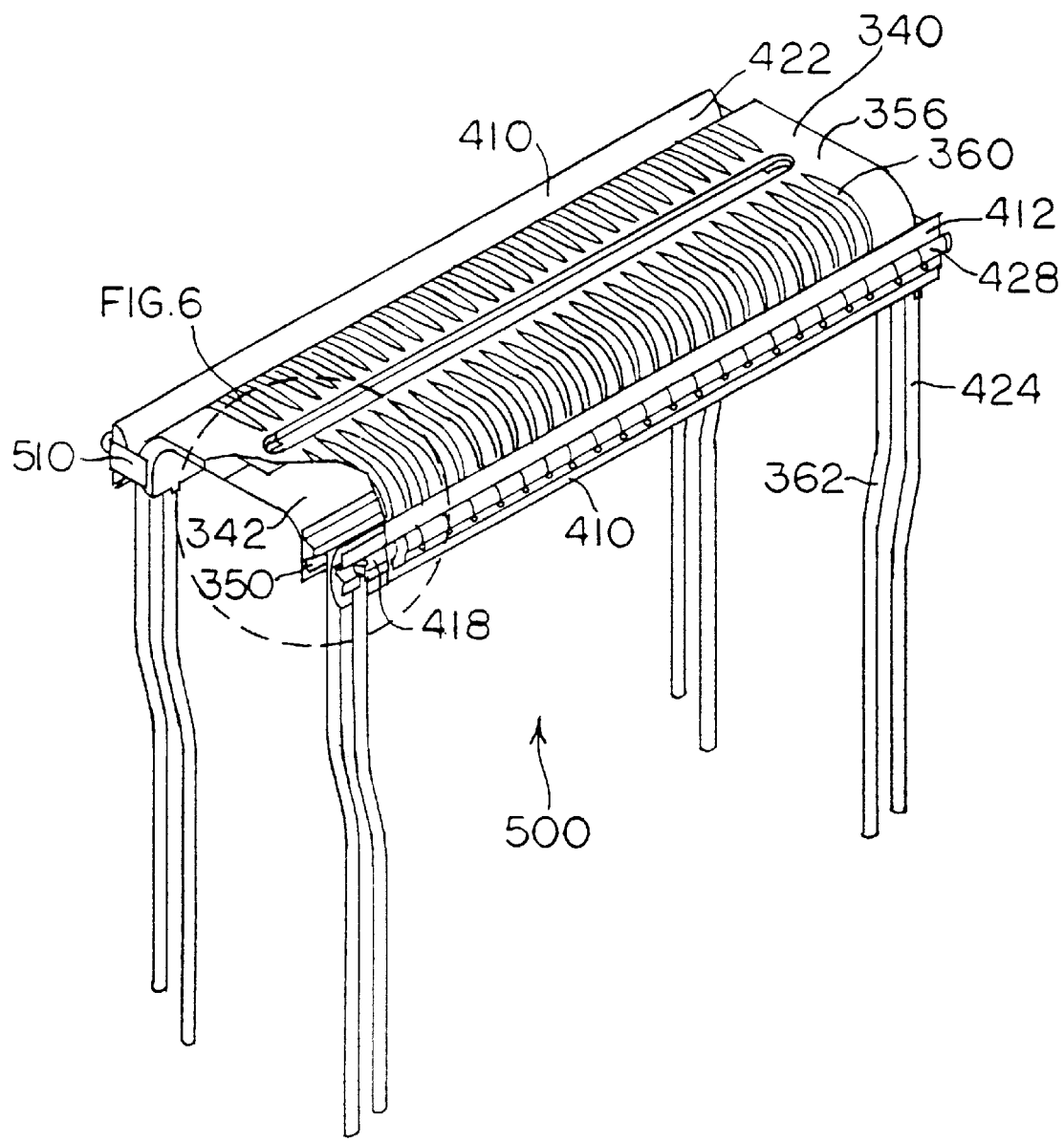
FIG. 5 is a partially cut-away perspective view of a nitrogen shield distributor assembly according to the present invention.

Referring briefly to FIG. 5, the nitrogen distributor assembly consists of primary nitrogen distributor 340, accompanied on each side by a secondary nitrogen distributor 410. FIG. 3 is an exploded view of a preferred embodiment of primary nitrogen distributor 340. Primary distributor shell 342 comprises a generally "C" shaped metal form. It may be fabricated as two separate pieces and joined along a longitudinal axis down the center of the distributor. A window 344 may be formed in primary distributor 342 in order for process gas injector nozzle 216 to have access through primary distributor 340 to workpieces (wafers) that are conveyed past it for processing (see FIG. 7). In the illustrated embodiment, window reinforcements 346 are affixed to the primary distributor at each end of window 344. Primary shell ends 348 are also provided as illustrated.

A primary plenum member 350 is formed of stainless steel and attached, for example by welding, to each side of primary distributor 342 as illustrated. Primary plenum member 350, when attached to primary shell 342, provides an enclosed space or plenum into which nitrogen may be injected in order to be dispersed by primary nitrogen distributor 340. Each primary plenum member 350 is perforated by a plurality of holes drilled therein 352. In some embodiments, each longitudinal edge of plenum member 350 may be bent away from shell 342 in order to provide additional mechanical strength or stiffness to the completed assembly. The holes 352 in primary plenum member 350 are overlaid by primary baffle 354, which intercepts the directed streams of nitrogen exiting the plenum through holes 352. Primary baffle 354 is attached, as by welding, to primary plenum member 350 along the peak 353 of plenum member 350, and the free edge 355 is spaced from plenum member 350 so that nitrogen can flow through the space thus created. (FIG. 6 shows a detail of the plenum and baffle assembly.) In use, nitrogen is supplied to the plenum by tubes 362, and it exits the plenum through holes 352. The gas, expanding into the space is part defined by baffle 354 and the outer wall of plenum member 350, loses much of its local velocity and exits the distributor as a diffuse and uniform flow.

Primary screen 356 is configured to cover and enclose primary plenum member 350, primary baffles 354 and to form an enclosed space between itself and primary shell 342. Primary screen 356 is provided with an elongated window 358 which aligns with window 344 in primary shell 342. These windows 358, 344, are provided to permit process gas injector nozzles to be directed therethrough during semiconductor wafer processing. Primary screen 356 is provided with stress relief contours 360 as shown in FIG. 3. These stress relief contours serve to permit primary screen 356 to flex like a bellows when stressed by thermal cycling of the system. Note that in preferred embodiments the stress relief contours 360 extend across the top surface of primary screen 356 as well as around the curved sides of primary screen 356, occupying substantially the entire width of primary screen 356.

Note that an enclosed space is formed by primary shell 342, primary screen 356 and primary shell ends 348, as well as sealing features around windows 358 and 344. Nitrogen that exits plenum 350 through holes 352 makes its way around primary baffle 354 and into that enclosed space. From there, it exits primary nitrogen distributor 340 through the plurality of small holes formed in primary screen 356.

In preferred assembly methods, after the above-described components are assembled, then primary tubes 362 are inserted through holes formed in primary screen 356 and into primary plenum 350 and into position as shown in FIG. 6. Primary tubes 362 may be secured into place by welding to tube attachment tabs 363 formed on primary shell 342. Primary tubes 362 may then be used to introduce nitrogen into the space formed between primary plenum 350 and primary shell 342. It is advantageous to be able to assemble the distributor without the tubes 362 attached, and then to install the tubes as a final step in the assembly process.

Referring to FIGS. 3A and 3B, plenum member 350 is a folded and elongated piece of sheet metal that is attached to shell 342. Alternatively, plenum member 350 could be extruded in the form shown. In the illustrated preferred embodiment, plenum member 350 has two attachment portions 370 that are substantially coplanar and that are used to attach the plenum to shell 342, such as by welding. Plenum member 350 also has a raised portion 372 located between attachment portions 370. Raised portion 372 cooperates with shell 342 to form an enclosed space 374 into which nitrogen is introduced for distribution. Raised portion 372 is perforated by holes 352 to allow nitrogen to exit enclosed space 374. As shown in FIG. 3B, one edge of baffle 355 is attached to raised portion 372 of plenum member 350, and the free edge 355 of baffle 354 is spaced from the surface of plenum member 350. It will be appreciated that gas that is introduced into enclosed space 374 formed by plenum member 350 will exit through holes 352, into the space beneath baffle 354, and flow uniformly outward through the space between free end 355 of baffle and plenum member 350. Plenum member 350 may also have edge portions 376 that are bent upward from attachment portions 370, which serve to further stiffen plenum member 350 and the assembly into which it is incorporated. In presently preferred embodiments, this plenum and baffle arrangement is used in the primary distributor and in the secondary distributors, which are described below.

Figure 4:
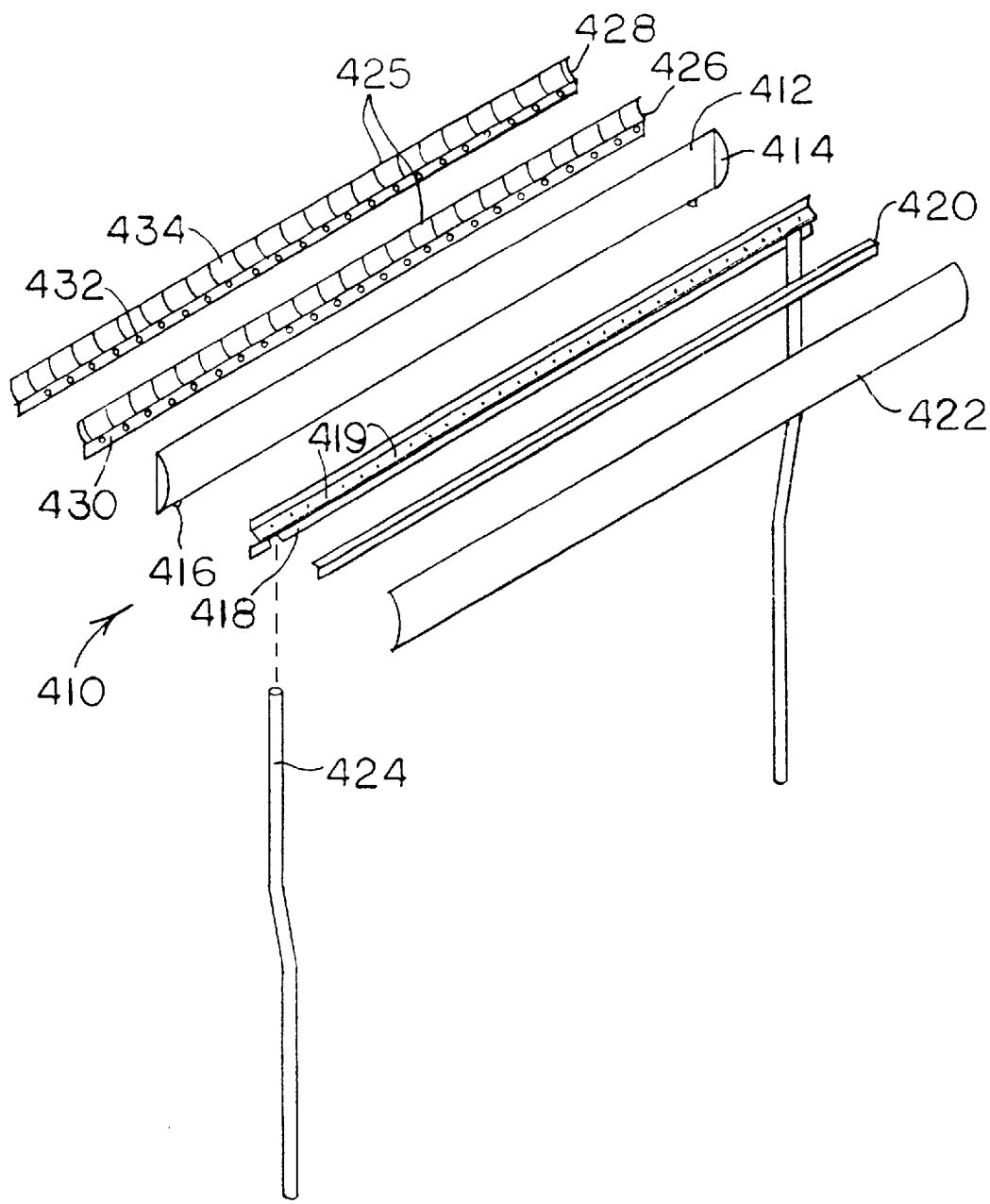
FIG. 4 is an exploded perspective view of a secondary distributor according to the present invention.

FIG. 4 shows an exploded view of secondary nitrogen distributor 410. Secondary shell 412 is a formed piece of metal sheet that provides a foundation for secondary distributor 410. In preferred embodiments, secondary shell 412 has end sections 414 bent at ninety degree angles to the plane of shell 412, and it has tube attachments tabs 416 formed thereon as shown in FIG. 4. Secondary plenum member 418 and baffle 420 may be formed and assembled in the same manner as the corresponding components of primary distributor 340 described above. Secondary plenum member 418 is attached by welding to the surface of secondary shell 412 forming an enclosed space there between. This arrangement of a rigid formed plenum member 418 welded to secondary shell 412 provides a relatively stiff secondary nitrogen distributor 410 as compared to the prior art. Secondary plenum member 418 is perforated by a plurality of holes 419 which allow nitrogen to exit the plenum space into to the space formed between secondary shell 412 and secondary screen 422. Secondary baffle 420 is provided to aid in forming a uniform flow of nitrogen within secondary distributor 410, identical in function to primary baffle 354 discussed above. Secondary screen 422 is a stainless steel screen material that is installed around secondary plenum member 418 and secondary baffle 420 and attached to secondary shell 412. The combination of secondary shell 412, secondary screen 422, and end portions of 414 provide an enclosed space. After the above referenced assembly is put together, secondary delivery tubes 424 may be inserted through holes in secondary screen 422 provided for that purpose and into the appropriate openings in secondary plenum member 418. Tubes 424 may then be secured in place by welding to tube attachment tabs 416. The assembly of the secondary shell, plenum, baffle and delivery tubes may be identical to the assembly of the corresponding primary components, as may be seen in the detailed view of FIG. 6.

In order to ensure that the exhaust gasses from the CVD process exit the vicinity of the processing operation by passing between the primary and secondary distributors, sealing elements are provided for blocking the spaces between the outboard sides of the secondary distributors and the enclosure into which the assembly is inserted. In the prior art embodiments, the seal that is disposed on the outboard side of the secondary distributors is a single sheet of flexible steel 226 (FIG. 2B) welded to the outboard side of the secondary shell 227. This arrangement has been improved on in the present invention.

Referring to FIG. 4, in preferred embodiments of the present invention, secondary seal 425 is composed of two layers of flexible metal provided on the outboard side of secondary shell 412. Secondary seal 425 comprises inner secondary seal 426 and outer secondary seal 428. Each of these secondary seals 426, 428, comprises a spine section 430 along one edge, which may be perforated by a number of holes 432 positioned at regular intervals. Connected to one side of spine 430 is a continuous series of integral independent segments 434, which may be formed by starting with a strip of metal and cutting it part way across from one side at regular intervals. The segmented portion of each seal is outwardly bent or curved away from the back of secondary shell 412 in order to effect a somewhat resilient seal between secondary shell 412 and the enclosure into which the nitrogen distributor assembly is inserted during use. (See detail in FIG. 6.) The segments 434 may be uniformly curved as shown in FIG. 6 to facilitate insertion of the assembly into its enclosure while ensuring an adequate seal. Inner secondary seal 426 is first attached to secondary shell 412 by din spine portion 430 of seal 426 to shell 412, with the weldments formed between holes 432 in spine 430. Outer seal 428 is then positioned on top of inner seal 426, such that the segments and holes of outer seal 428 are offset from those of inner seal 426 with the spines 430 of both seals overlying one another. The spine 430 of outer secondary seal 428 is then welded directly the back surface of secondary shell 412 through the holes 432 formed in inner secondary seal 426. Persons skilled in the art will recognize that other methods may be used for attaching the secondary seals to the secondary shell. The segmented portions of outer seal 428 and inner seal 426 are arranged similar to roofing shingles, such that each slit between segments of the inner seal is covered by a segment of the outer seal. The secondary seal arrangement 425 described above and illustrated in FIG. 4 is conformal, and it will resist buckling or leaking even if secondary distributor 410 flexes somewhat due to mechanical or thermal stresses, due to the two layer, segmented arrangement provided by this invention.

In presently preferred embodiments, the primary and secondary screens 356, 422 are made of 0.008 inch 316 stainless steel, distributor shells 342, 414 are made of 0.035 inch 304 stainless steel, and tubes 424, 362 are made of 304 stainless steel, 3/16 inch diameter, with a 0.020 inch wall thickness. The plenums may also be manufactured from 0.035 inch 304 stainless steel. Of course, other materials may be used to implement the invention.

FIG. 5 shows a preferred embodiment of completed nitrogen distributor assembly 500 with the outer layers of the foremost comer cut away so that the underlying configuration may be seen. (FIG. 6 shows a detailed view of that comer.) Note that each secondary distributor is attached to the primary distributor by two end brackets 510, one attached to each end of the apparatus. A gap is preserved between secondary screen 422 and primary screen 356, this providing an exhaust channel for process gasses and shield nitrogen to exit the vicinity of the workpiece.

In operation, nitrogen is supplied through secondary tubes 424 and primary tubes 362. The nitrogen enters primary plenums 350 and secondary plenums 418, exits the plenums through the holes drilled therein, and emerges beneath primary baffles 354 and secondary baffles 420, respectively. The nitrogen then travels around the free edges of the baffles and into the spaces formed between primary shell 342 and primary screen 356, and between secondary shell 412 and secondary screen 422. The nitrogen then uniformly exits primary distributor 340 and secondary distributors 410 through primary screen 356 and secondary screen 422, respectively, in order to blanket the work piece outside of the immediate vicinity of the process nozzle and to dilute any unused or spent reactant gasses, before they are removed by the exhaust system. It has been found that the nitrogen distributor assembly as illustrated and described herein reduces powdering due to the uniform flow and unobstructed egress of the nitrogen from the distributor assembly.

Referring to FIG. 6, an expanded view of the cutaway comer of the preferred embodiment shown in FIG. 5 is illustrated. The shape of primary plenum member 350 and secondary plenum member 418 are shown clearly in this figure, as is the placement of primary baffle 354 and secondary baffle 420 over the holes in each of the plenums. The upper edge of each baffle 354, 420 is free and spaced from the respective plenum member, so the nitrogen may flow through the gap formed between the plenum member and the baffle. The plenum shape is designed to provide structural stiffness to the assembly when a plenum is welded to primary shell 342 or secondary shell 412. The penetration of secondary tube 424 into secondary plenum 418 is clearly indicated in this figure. Primary tube attachment tab 416 can be seen adjacent primary tube 362. A welded connection may be formed between these two components when final assembly is performed in order to retain primary tube 362 in place inserted into primary plenum 354. This arrangement may be used to connect all of the nitrogen supply tubes to the assembly. Note that in this embodiment a supply tube is connected to each end of each plenum member.

In an alternative embodiment of this invention, the primary screen 356 as well as secondary screens 422 may be constructed of a woven wire mesh material rather than wire screen material as in the preferred embodiment. As discussed above, the bellows-shaped configuration of the primary screen, which may alternatively be a wrinkled finish, prevents failure due to stresses related to thermal cycling. In one aspect, the invention comprises extending the stress relieving features around the curved sides of primary screen 356.

Figure 7:
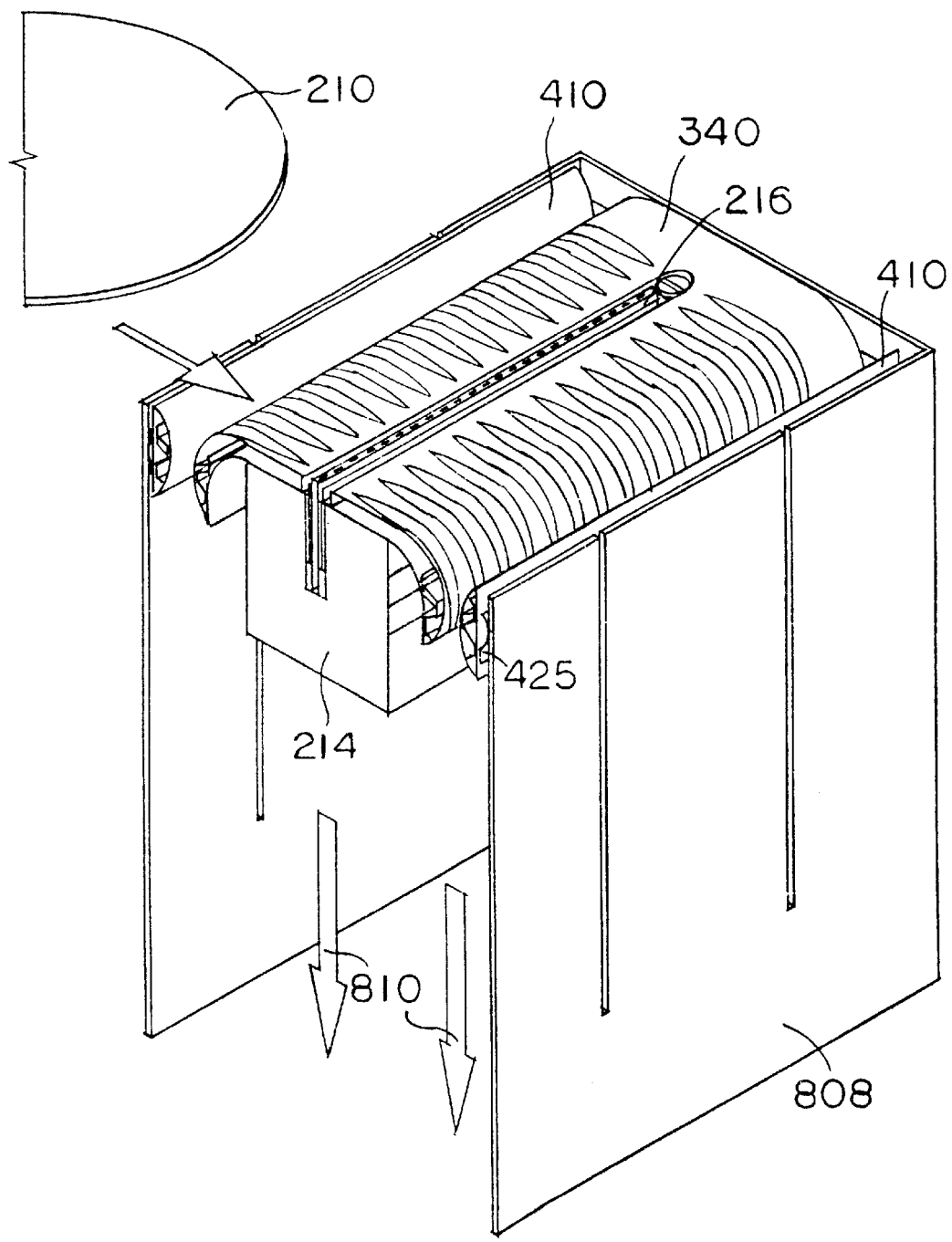
FIG. 7 is a perspective cross-sectional view of a nitrogen shield distributor assembly according to the present invention in combination with the corresponding injection head and nozzle and the enclosure in which the assembly is located.

Referring to FIG. 7, in its operative condition a preferred embodiment of the present invention is slidably inserted into enclosure housing 808 in an atmospheric pressure chemical vapor deposition apparatus used for processing semiconductor wafers. FIG. 7 shows the nitrogen distributor assembly 500 of FIG. 5, illustrated in cross-sectional perspective view, positioned within enclosure 808. Injector head 214 and associated injector nozzle 216, which are outside of the scope of this invention, are shown operatively engaged with primary distributor 340, with nozzle 216 protruding through window 358. Secondary distributors 410 are shown positioned on both sides of primary distributor 340, with exhaust spaces maintained between the lateral edges of primary distributor 340 and each secondary distributor 410.

Secondary seals 425 are fastened to the back of each secondary distributor 410, and when the nitrogen distributor assembly 500 is operatively positioned in enclosure 808 the secondary seals 425 engage the interior surfaces of enclosure 808 to prevent process gasses or blanket gasses from traveling between secondary distributors 410 and enclosure walls 808. As was described above in connection with FIG. 4, in preferred embodiments secondary seal 425 comprises multiple layers of flexible slotted sealing elements or segments which cooperate to ensure a good conformal seal between secondary distributor 410 and enclosure wall 808, even if there is some degree of bending in secondary distributor 410 due to stresses applied thereto. In presently preferred embodiments, the secondary seals are formed from 0.005 inch thick 302 stainless steel, which is slotted or segmented similar to roof shingles.

In operation, wafer 210 is conveyed past injector nozzle 216 which directs a flow of a selected process gas or combination of process gasses toward the surface of wafer 210, where the process gasses react with wafer 210 to accomplish a desired process step. At the same time, a flow of inert gas such as nitrogen is injected into primary distributor 340 and secondary distributors 410, and an exhaust flow is established through the gaps between the lateral edges of primary distributor 340 and each secondary distributor 410 and out of enclosure 808, as indicated by arrows 810. This arrangement establishes a protective blanket of inert gas over the surface of the wafer, thereby facilitating precise control of the APCVD process by shielding the processing area from environmental contaminants. The flow of inert gas also serves to dilute and remove any excess or spent process gas or reaction products that may be present in the vicinity of the wafer.

This description of the invention has been directed toward describing an exemplary preferred embodiment, which is a nitrogen blanket distributor in an APCVD apparatus. The invention may be beneficially used in other applications as well, for distributing other gasses or for use in other processes. The scope of the invention is not intended to be limited to the specifically described embodiments and applications.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts and in material selection and specification. For example, equivalent elements may be substituted for those illustrated and described herein, and certain features of the invention may be utilized independently of the use of other features, all as would be apparent to one skilled in the art after having the benefit of this description of the invention.

I claim:

1. A gas blanket distributor assembly for use in a reaction chamber, said distributor assembly comprising a primary distributor having a window for passage of an injection nozzle therethrough and a secondary distributor positioned beside and spaced from the primary distributor, each distributor comprising a plenum member attached to a shell, each plenum member being formed of an elongated piece of rigid material formed to provide two elongated and substantially parallel attachment portions separated by a raised portion, wherein the raised portion of the plenum member and the shell define an enclosed space when the plenum member is attached to the shell.

2. The distributor assembly of claim 1, wherein the plenum member further comprises an edge portion that is outwardly bent from the adjacent attachment portion.

3. The distributor assembly of claim 1, wherein the plenum member is perforated by a plurality of holes formed in the raised portion, and further comprising a baffle having one edge attached to the raised portion of the plenum member and the other edge spaced from the plenum member, the baffle positioned to cover said holes without sealing them.

4. The distributor assembly of claim 1, further comprising a primary screen having stress relief contours extending laterally across the screen substantially from the window to the edge of the screen.

5. The distributor assembly of claim 1, further comprising a primary screen having stress relief contours extending laterally around the curved portion of the screen.

6. The distributor assembly of claim 1, further comprising a primary screen made of woven metal material.

7. The distributor assembly of claim 6, wherein the primary screen is made of woven stainless steel material.

8. A gas blanket distributor for use in a semiconductor processing apparatus, the distributor having a lateral sealing assembly for inhibiting the flow of gas between a lateral side of the distributor and an enclosure in which the distributor is disposed, the sealing assembly comprising:

first and second sealing strips each having a longitudinal spine portion adjacent one edge and a sealing portion adjacent the other edge, the sealing portion being divided into segments by slots formed across the sealing portion and terminating prior to traversing the spine portion;

said spine portion of said first sealing strip being attached along its length to the lateral side of the distributor;

said spine portion of the second sealing strip being overlaid upon the spine portion of the first sealing strip such that the segments of the second sealing strip cover the slots of the first sealing strip.

9. The gas blanket distributor of claim 8, wherein the spine portion of the first sealing strip has a plurality of holes formed therein, and wherein the second sealing strip is attached directly to the distributor at the locations of the holes in the first sealing strip.

10. The gas blanket distributor of claim 8, wherein the first and second sealing strips are made of stainless steel.

11. A gas blanket distributor for use in a semiconductor processing apparatus, comprising:

primary distributor means for distributing a uniform flow of gas in the vicinity of a process gas injector;

secondary distributor means for distributing a uniform flow of gas, said secondary distributor means being spaced from said primary distributor means by an exhaust channel;

said secondary distributor means comprising a shell and a plenum member which cooperate to form an enclosed gas distribution chamber.

12. The distributor of claim 11, wherein the plenum member is formed of an elongated piece of rigid material formed to provide two elongated and substantially parallel attachment portions separated by a raised portion.

13. The distributor of claim 11, wherein said primary distributor means comprises a shell and a plenum member which cooperate to form an enclosed gas distribution chamber.

* * * * *